(12) United States Patent
Venkataraman et al.

(10) Patent No.: US 6,763,493 B2
(45) Date of Patent: Jul. 13, 2004

(54) METHOD AND SYSTEM FOR PERFORMING DECODING USING A REDUCED-MEMORY IMPLEMENTATION

(75) Inventors: Bharath Venkataraman, Germantown, MD (US); Roger Hammons, N. Potomac, MD (US); Mustafa Eroz, Germantown, MD (US)

(73) Assignee: The DIRECTV Group, Inc., El Segundo, CA (US)

( * ) Notice: Subject to any disclaimer, the term of this patent is extended or adjusted under 35 U.S.C. 154(b) by 414 days.

(21) Appl. No.: 09/957,749

(22) Filed: Sep. 21, 2001

(65) Prior Publication Data

US 2003/0061563 A1 Mar. 27, 2003

(51) Int. Cl.[7] .............................................. H03M 13/45
(52) U.S. Cl. ...................................... 714/780; 714/786
(58) Field of Search ................................. 714/780, 786

(56) References Cited

U.S. PATENT DOCUMENTS

| | | | | |
|---|---|---|---|---|
| 5,335,250 A | * | 8/1994 | Dent et al. ................... 375/224 |
| 5,446,763 A | * | 8/1995 | Baum et al. ................. 375/340 |
| 5,513,215 A | * | 4/1996 | Marchetto et al. ........... 375/233 |
| 5,594,742 A | * | 1/1997 | Hemmati ..................... 714/792 |
| 5,648,991 A | * | 7/1997 | Namekata et al. ........... 375/341 |
| 5,721,745 A | * | 2/1998 | Hladik et al. ................ 714/755 |
| 5,721,746 A | * | 2/1998 | Hladik et al. ................ 714/792 |
| 5,841,817 A | * | 11/1998 | Krieger et al. ............... 375/340 |
| 5,909,465 A | * | 6/1999 | Bottomley et al. .......... 375/227 |
| 5,917,863 A | * | 6/1999 | Soichi et al. ................ 375/341 |
| 5,930,296 A | * | 7/1999 | Kot ............................. 375/233 |
| 5,933,462 A | * | 8/1999 | Viterbi et al. ................ 375/341 |
| 6,263,467 B1 | * | 7/2001 | Hladik et al. ................ 714/755 |
| 6,304,996 B1 | * | 10/2001 | Van Stralen et al. ........ 714/796 |
| 6,343,368 B1 | * | 1/2002 | Lerzer ......................... 714/796 |
| 6,381,728 B1 | * | 4/2002 | Kang ........................... 714/781 |
| 6,397,358 B1 | * | 5/2002 | Burton et al. ................ 714/705 |
| 6,484,283 B2 | * | 11/2002 | Stephen et al. .............. 714/786 |
| 6,484,285 B1 | * | 11/2002 | Dent ............................ 714/791 |
| 6,516,437 B1 | * | 2/2003 | Van Stralen et al. ........ 714/755 |
| 6,563,877 B1 | * | 5/2003 | Abbaszadeh ................ 375/242 |
| 6,563,890 B2 | * | 5/2003 | Obuchi et al. ............... 375/341 |
| 6,567,481 B1 | * | 5/2003 | Molnar ........................ 375/341 |
| 6,580,767 B1 | * | 6/2003 | Koehler et al. .............. 375/341 |
| 6,594,792 B1 | * | 7/2003 | Hladik et al. ................ 714/755 |
| 6,597,743 B1 | * | 7/2003 | Khayrallah et al. ......... 375/265 |
| 6,598,204 B1 | * | 7/2003 | Giese et al. ................. 714/795 |
| 6,603,412 B2 | * | 8/2003 | Gatherer et al. ............. 341/61 |
| 6,606,725 B1 | * | 8/2003 | Wang et al. ................. 714/755 |
| 6,633,615 B1 | * | 10/2003 | Pekarich et al. ............ 375/265 |
| 6,658,071 B1 | * | 12/2003 | Cheng ......................... 375/348 |

* cited by examiner

*Primary Examiner*—Stephen M. Baker
(74) *Attorney, Agent, or Firm*—John T. Whelan

(57) ABSTRACT

An approach for performing computations that require processing of values in a forward sweep as well as a reverse sweep, such as the Maximum A Posteriori (MAP) algorithm, is disclosed. A first series of values are computed, in which only every $f^{th}$ value of the first series of values and associated normalization values are stored. The first series of values are indexed such that these first series of values are partitioned in time as blocks. The first series of values are recalculated on a per block basis, whereby a second series of values are calculated in response to these recalculated first series of values.

39 Claims, 8 Drawing Sheets

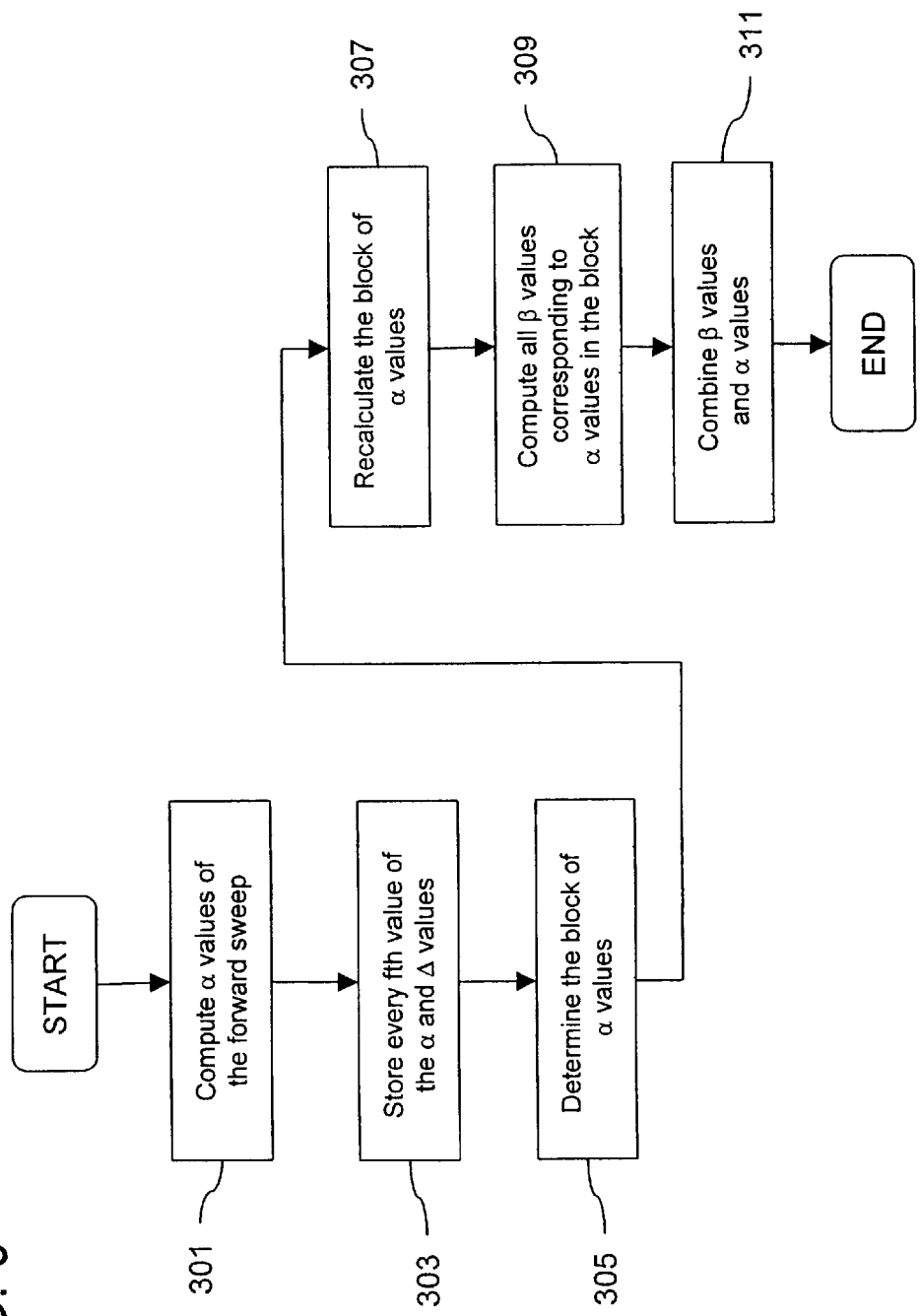

METHOD AND SYSTEM FOR PERFORMING DECODING USING A REDUCED-MEMORY IMPLEMENTATION

BACKGROUND OF THE INVENTION

1. Field of the Invention

The present invention relates generally to communication systems, and is more particularly related to decoding of received signals from a communication channel.

2. Discussion of the Background

Reliable communication over noisy communication channels depends largely from the manner in which the signals are encoded and decoded. Traditionally, Soft Output Viterbi Algorithm (SOVA) is employed in maximum likelihood decoders to decode convolutionally encoded signals. An alternative algorithm, known as the Maximum A Posteriori (MAP) algorithm, has been developed, which provides an optimal symbol decision algorithm [1] for linear block and convolutional codes. The MAP algorithm exhibits superior performance over the SOVA; however, because of the implementation complexities of this algorithm, the MAP algorithm has not enjoyed the same success, in terms of industry acceptance, as that of the SOVA.

The emergence of Turbo codes has sparked great interest in decoding algorithms. Particularly, developments in Turbo codes have stimulated communication engineers to revisit the possibility of using the MAP algorithm within constituent decoders. Again, the conclusion is that the SOVA is preferred, strictly from the perspective of ease (and therefore, cost) of deployment, despite the inferior performance of the SOVA as compared to the MAP algorithm. Specifically, engineering studies have shown that the performance of the SOVA is 0.3–0.5 dB lower than the MAP algorithm. Nevertheless, because of the implementation complexity, most constituent decoders are based on the SOVA. This complexity stems primarily from the fact traditional MAP algorithm implementations require a significant amount of memory to store the computational parameters.

Based on the foregoing, there is a clear need for improved approaches for implementing the MAP algorithm with reduced complexity.

There is also a need to minimize the memory requirements for the computations of the MAP algorithm.

Based on the need to minimize the complexity of the decoding algorithm, an approach for performing computations that require minimal memory is highly desirable.

SUMMARY OF THE INVENTION

The present invention addresses the above stated needs by providing a capability to efficiently utilize memory in a computation that requires processing values in a forward sweep and a reverse sweep, such as the Maximum A Posteriori (MAP) algorithm. A first series of values are computed, in which only every $f^{th}$ value are stored. The first series of values are indexed such that these first series of values are partitioned in time as blocks. The first series of values are recalculated on a per block basis, whereby a second series of values are calculated in response to these recalculated first series of values.

According to one aspect of the invention, a method of performing computations is disclosed. The method includes calculating a first series of values based upon a plurality of input values, and storing the first series of values according to a predetermined scheme. Also, the method includes recalculating the first series of values starting with a last value of the first series towards a first value of the first series. The method further includes calculating a second series of values and generating a plurality of output values based upon the recalculated first series of values and the second series of values. The above arrangement advantageously minimizes storage requirements without sacrificing computational accuracy.

According to another aspect of the invention, a decoding apparatus comprises means for calculating a first series of values based upon a plurality of input values. The decoding apparatus also includes means for storing the first series of values according to a predetermined scheme. Additionally, the decoding apparatus includes means for recalculating the first series of values starting with a last value of the first series towards a first value of the first series, and means for calculating a second series of values. The decoding apparatus further includes means for generating a plurality of output values based upon the recalculated first series of values and the second series of values. Under this approach, the complexity of implementing the MAP algorithm is reduced.

According to another aspect of the invention, a method is provided for decoding a bit stream received from a communication channel. The method includes receiving a plurality of transition probability values, and calculating a first series of values based upon the plurality of transition probability values. The method also includes periodically storing the first series of values based upon a predetermined period (f), wherein the first series of values are partitioned into blocks corresponding to the predetermined period. The method also includes recalculating the first series of values associated with each of the blocks. Further, the method encompasses calculating a second series of values, wherein the second series of values are calculated in reverse order relative to the first series of values. The above arrangement advantageously enhances the feasibility of performing decoding using the MAP algorithm.

According to another aspect of the invention, a decoder for performing a Maximum A Posteriori (MAP) algorithm to decode a bit stream received from a communication channel is disclosed. A γ computation module is configured to output a plurality of transition probability values in response to a plurality of soft decision input values. An α computation module is configured to calculate α values based upon the plurality of transition probability values. A memory is configured to store periodically the α values based upon a predetermined period (f). The α values are partitioned into blocks corresponding to the predetermined period. A recalculating module is configured to recalculate the α values within each of the blocks. A β computation module is configured to calculate β values based upon the recalculated α values, wherein the β values are calculated in reverse order relative to the α values. The above approach advantageously reduces the memory requirements of a decoder.

According to another aspect of the invention, a decoding system for decoding at least one of linear block codes and convolutional codes corresponding to a bit stream is disclosed. A soft decision module is configured to generate a plurality of soft decision input values associated with the bit stream. A plurality of decoders are coupled to the soft decision module. Each of the plurality of decoders comprises a γ computation module that is configured to output a plurality of transition probability values in response to the plurality of soft decision input values, an α computation module that is configured to calculate α values based upon the plurality of transition probability values, and a memory that is configured to store periodically the α values based upon a predetermined period (f). The α values are partitioned into blocks corresponding to the predetermined period. Each of the decoders also includes a recalculating module that is configured to recalculate the α values within each of the blocks, and a β computation module that is configured to calculate β values based upon the recalculated α values. The β values are calculated in reverse order relative to the α values. The above arrangement advantageously minimizes the complexity of decoding linear block codes and convolutional codes.

In yet another aspect of the invention, a computer-readable medium carrying one or more sequences of one or more instructions for performing computations is disclosed. The one or more sequences of one or more instructions include instructions which, when executed by one or more processors, cause the one or more processors to perform the steps of calculating a first series of values based upon a plurality of input values, and storing the first series of values according to a predetermined scheme. Other steps include recalculating the first series of values starting with a last value of the first series towards a first value of the first series, calculating a second series of values, and generating a plurality of output values based upon the recalculated first series of values and the second series of values. This approach reduces the cost of equivalent decoders by minimizing the use of memory to store intermediate values during computation.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3 is a flowchart of the operation of the MAP algorithm, in accordance with an embodiment of the present invention;

DESCRIPTION OF THE PREFERRED EMBODIMENTS

In the following description, for the purpose of explanation, specific details are set forth in order to provide a thorough understanding of the invention. However, it will be apparent that the invention may be practiced without these specific details. In some instances, well-known structures and devices are depicted in block diagram form in order to avoid unnecessarily obscuring the invention.

Although the present invention is described with respect to the Maximum A Posteriori (MAP) algorithm, it is recognized that the approach, according to the present invention, has applicability to any computations that process a series of values in a forward sweep and reverse sweep.

The MAP algorithm, as described herein, may be used for optimal performance in any decoder for block and convolutional codes, that is, in any product using a Forward Error Correction (FEC) mechanism. To better understand the implementation complexities of the MAP algorithm, it is instructive to visit the operation of one implementation of the MAP algorithm that requires expansive amounts of memory for execution, as described below in FIGS. 6 and 7.

Figure 6:
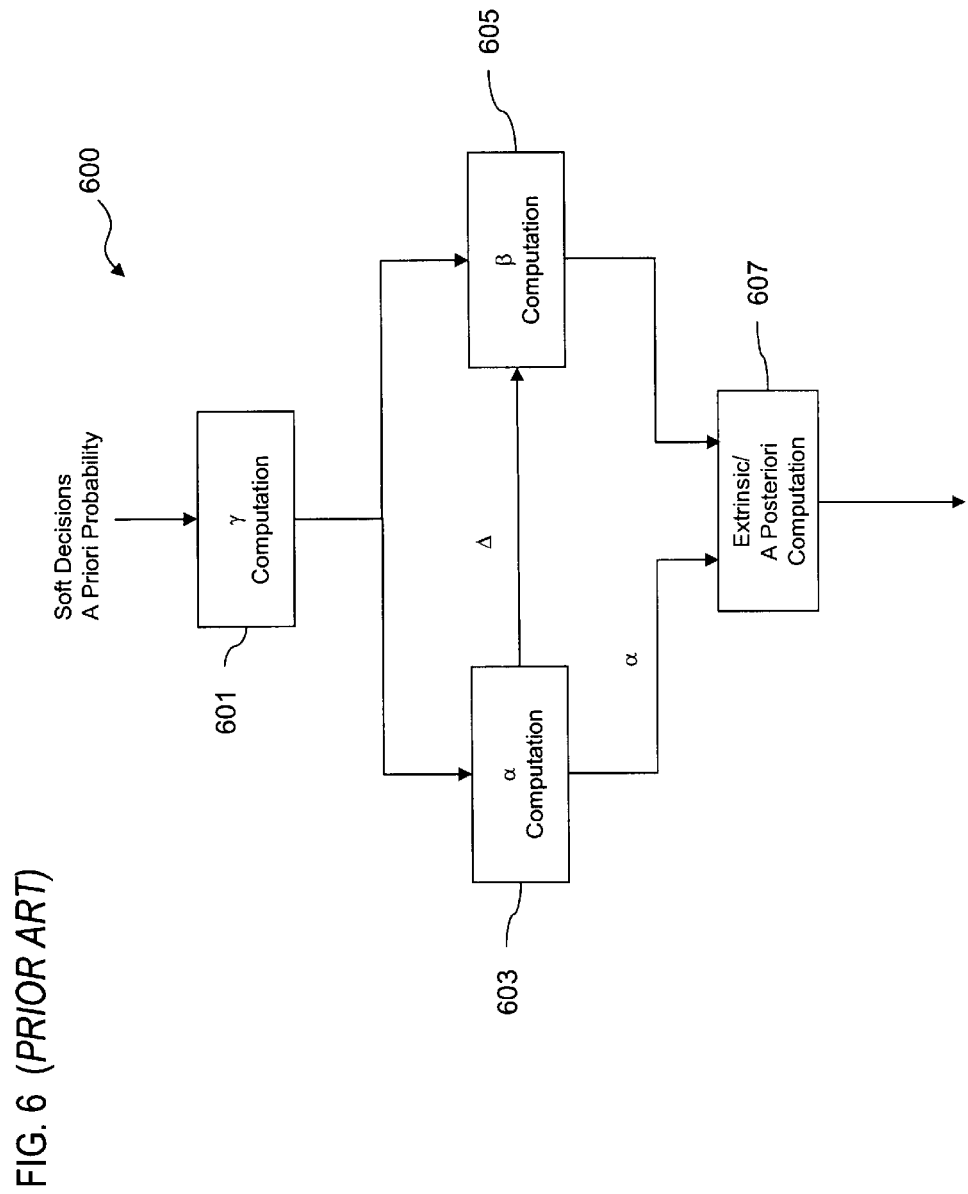
FIG. 6 is a diagram of a memory intensive implementation of the MAP algorithm.

FIG. 6 shows a diagram of an implementation of the MAP algorithm that utilizes memory inefficiently. The MAP algorithm has been shown to minimize the symbol error probability for linear block and convolutional codes [1]. Encoded bits are sent out into the channel and received by a demodulator (not shown). The encoded bits may be considered in the form of a state trellis diagram. For the binary case, each state can transition to two other states with the introduction of a systematic bit (either 0 or 1). The probability (γ) of transitioning from one state to another depends on the signal-to-noise ratio (SNR) and the soft decisions generated by the demodulator. For the transition from state m' at time index (k−1) to state m at time index k, with information bit i and soft decisions ($y_k$) at time k, the probability of transition from one state to another (γ) may be defined in Eq. (1), as follows:

$$\gamma_i(k,m',m)=p(u_k=i,s_k=m,y_k|s_{k-1}=m')$$

The MAP algorithm has two processing sweeps—i.e., a forward sweep and a reverse sweep. The forward sweep processes the data in the order received from the demodulator and produces some values (α's and Δ's). The α values define the probability of being in a state (m) at time (k), given the values of the soft decisions (y), according to Eq. (2):

$$\alpha_k(m)=p(s_k=m|y_1,\ldots,k)$$

The reverse sweep processes the demodulated data in the reverse order and produces values (β's), computed as in Eq. (3):

$$\beta_k(m) = \frac{p(y_{k+1,\ldots,N} \mid s_k = m)}{p(y_{k+1,\ldots,N} \mid y_{1,\ldots,k})}$$

The α and β values may be computed in a recursive manner according to Eq. (4) and Eq. (5), respectively, as follows:

$$\alpha_k(m) = \frac{\sum_{m'}\sum_{i=0,1} \alpha_{k-1}(m')\gamma_i(k,m',m)}{\sum_m\sum_{m'}\sum_{i=0,1} \alpha_{k-1}(m')\gamma_i(k,m',m)}$$

$$\beta_k(m) = \frac{\sum_{m'}\sum_{i=0,1} \beta_{k+1}(m')\gamma_i(k+1,m,m')}{\sum_m\sum_{m'}\sum_{i=0,1} \alpha_k(m')\gamma_i(k+1,m',m)}$$

The denominator in the two above equations is defined as Δ (at time indices k and k+1, respectively), which serves as a normalization value. For each time index k, the α and β values (at time k−1 and k respectively) are combined to obtain probability estimates on whether the bit at that time index is 0 or 1. The α and β values at time (k−1) and k are needed to decide the probability estimate of a bit at time k.

As shown in FIG. 6, a MAP decoder 600 includes a γ computation section 601 that receives a priori probability values from the demodulator (not shown). γ computation section 601 outputs transition probabilities to an α computation section 603 and a β computation section 605. The output values from the α computation section 603 and the β computation section 605 are feed into an extrinsic/a posteriori computation section 607. The operation of the decoder 600 is described in FIG. 7.

Figure 7:
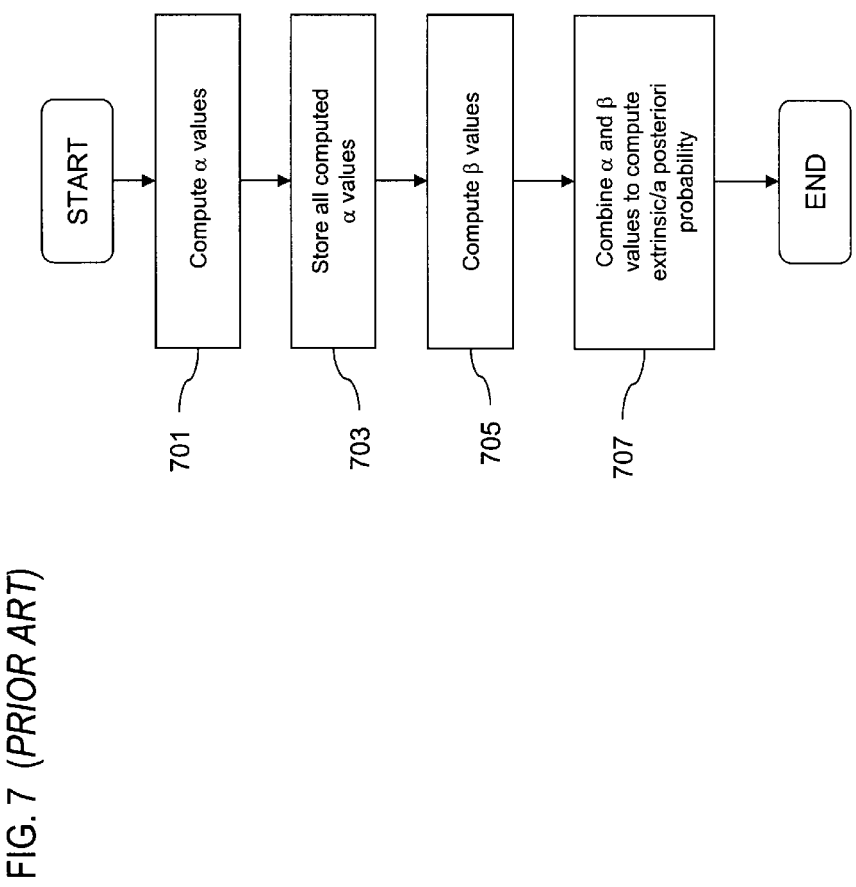
FIG. 7 is a flowchart of the operation of the MAP algorithm of FIG. 6.

FIG. 7 is a flowchart of the operation of the MAP algorithm of FIG. 6. In step 701, all the α values are computed by the a computation section 603. These computed α values are then stored, per step 703. Next, in step 705, the β computation section 605 computes the β values. Since the α and β values are computed recursively in opposite directions by α computation section 603 and β computation section 605, respectively, one of two scenarios exist. First, the α, β and Δ values may be simultaneously computed and stored. The values are then picked up one by one, to form the bit probabilities/decisions. The whole frame is stored first, and both the α and β values are stored. In the second scenario, the α or β values are computed first and stored in memory, followed by the β or α values, which are computed one by one. The β and α values may then be combined with the already stored value to form the bit probabilities/decisions.

Finally, the α, β and γ values are combined and modified to determine the "extrinsic information" [2]. As evident from the above description of the MAP algorithm, the α values need to be computed and stored, then the β values need to be computed and combined with the stored α values, per step 707, via the extrinsic/a posteriori computation section 607.

With the implementation described in FIGS. 6 and 7, the arithmetic operations required to compute α and β values recursively are relatively simple and a number of approximations may be made. However, such an implementation consumes a large amount of memory, which is required to store the α and β values. The following example illustrates how inefficiently the above implementation utilizes memory. It is assumed that the frame/trellis size/length of 2000 bits with 16 states is used; also, it is assumed that the computations are performed in byte-wide registers (8-bit values). At each time index (1 to 2000), the α value to be stored occupies 8 bits per state. Thus, to store the α values for the entire frame, the memory required equals 8*16*2000 (i.e., 32K) bytes of memory. This sizeable amount of memory is needed for each MAP decoder. Often, as in the case of Turbo Codes [2], 5–10 iterations of this decoder are used (in parallel) for optimum performance, thus yielding 160K–320K bytes of memory. By contrast, an embodiment of the present invention as applied to the MAP algorithm (shown in FIG. 2) requires significantly less memory to implement.

Figure 1:
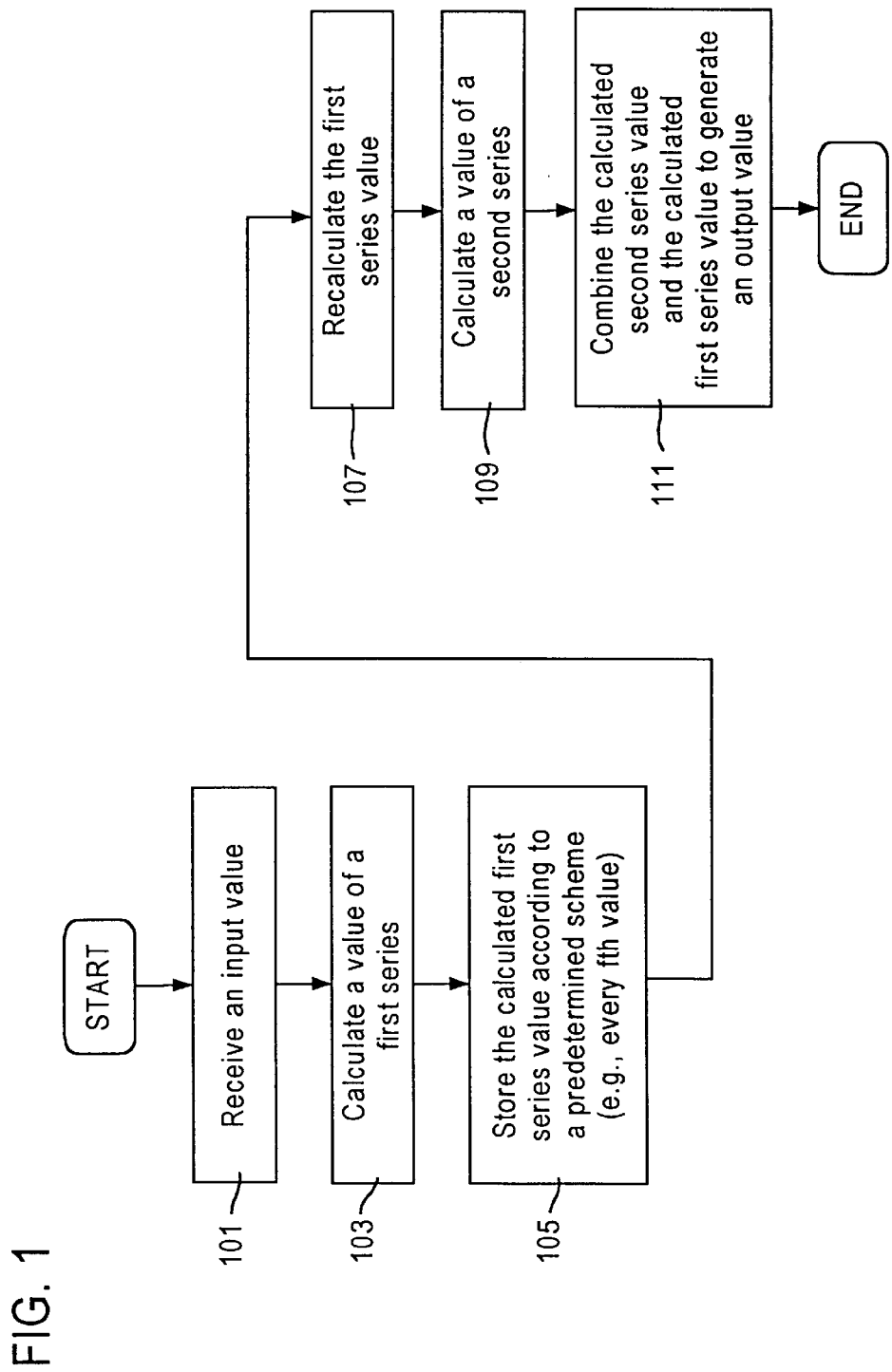
FIG. 1 is a flowchart of a process for performing computations, according to an embodiment of the present invention.

FIG. 1 shows a flowchart of a process for performing computations, according to an embodiment of the present invention. In step 101, a processor (not shown) receives an input value from multiple input values and calculates a value of a first series of values in response to the input value (per step 103). Under this approach, only some of the first series of values are stored for subsequent recalculation, according to a predetermined storage scheme, as in step 105. In one embodiment of the present invention, every $f^{th}$ value of the first series are stored thereby, conserving memory. In an exemplary embodiment, the first series values are partitioned into blocks for computational efficiency; that is, a block constitutes a grouping of values. This concept of partitioning is more fully described below with respect to FIGS. 2 and 3.

To obtain the necessary values of the first series, these values are recalculated, per step 109. Because of the partitioning, recalculation may be performed on a block by block basis such that the computation proceeds from the initial block to the last block and from the first value to the last value within the particular block. At this point, a value of a second series may be calculated, per step 107. In step 111, the calculated second series of value is combined with the recalculated first series of value to generate an output value. The block by block processing, according to an embodiment of the present invention, permits an output value to be generated prior to completely calculating the second series values. In other words, the second series values do not have to be entirely computed prior to generating an output value. The above approach may be applied to the MAP algorithm, as shown in FIGS. 2 and 3.

Figure 2:
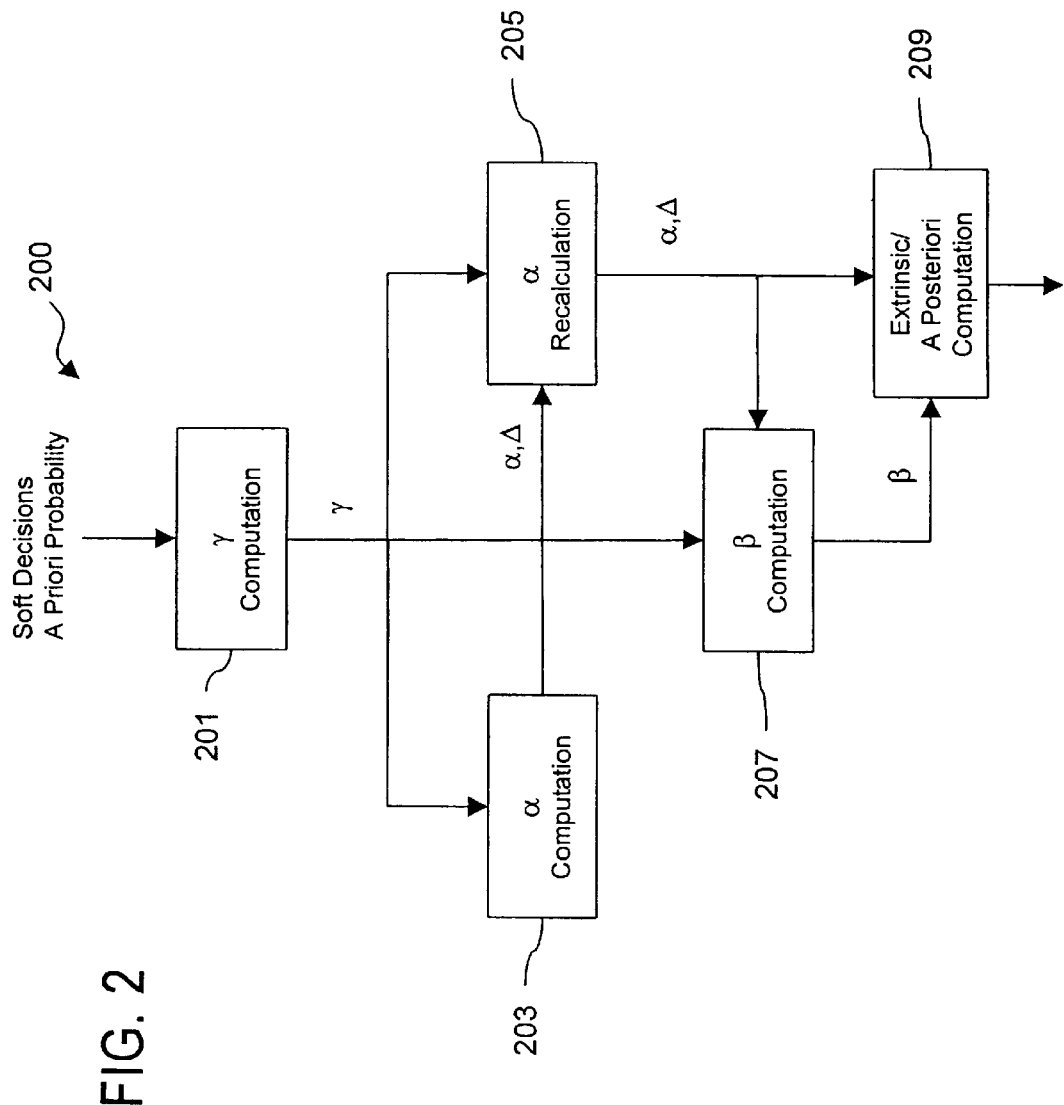
FIG. 2 is a diagram of an application of the computational approach of FIG. 1 to the Maximum A Posteriori (MAP) algorithm, according to an embodiment of the present invention.

FIG. 2 shows a diagram of an application of the computational approach of FIG. 1 to the Maximum A Posteriori (MAP) algorithm, according to an embodiment of the present invention. The idea behind coding is to provide the best possible BER (bit error rate) at the lowest possible signal-to-noise ratio (SNR)/power. The present invention permits use of the MAP algorithm to be implemented in a decoder over the traditional SOVA, thereby improving the BER (and/or use of less power).

A MAP decoder 200 includes a γ computation module 201 for receiving soft decisions/a priori probability values from a demodulator (not shown). As with decoder 600 of FIG. 6, decoder 200 has an α computation module 203 to generate α values. However, unlike decoder 600, decoder 200 employs an α recalculation module 205, which permits the selective storage of the α values. The operation of this α recalculation module 205 is more fully described below. Decoder 200 also includes a β computation module 207 for output the β values in response to the recalculated α values. An extrinsic/a posteriori computation module 209 combines the α and β values to produce the a posteriori probability values, in accordance with the MAP algorithm.

FIG. 3 shows a flowchart of the operation of the MAP algorithm, in accordance with an embodiment of the present invention. In step 301, the α values for the forward sweep are computed by the α computation module 203. To reduce the gate count for the implementation of MAP decoder 200, each and every α value (and associated Δ value) of the forward sweep need not be stored. Instead, every $f^{th}$ value (i.e., period) of the α and Δ values is stored in memory (not shown), per step 303. This period, f, determines the fraction of α and Δ values that are stored. The memory required for this implementation is as follows: BW *NS*{(F/f)+f} bits, where BW is the bit-width of the computations, NS is the number of states, F is the frame size, and f is the fraction of α values stored. To reduce the memory size, f should approximately equal √F. For the case of frame size of 2000 bits, the optimum number is √2000 (i.e., 44–45). α memory requirements yields 8*16*(2000/44+44) or 8 *16*(2000/45+45), which both result in 1440 (8*16*90) bytes of memory per MAP decoder 200. Further, the Δ memory requirements are 90 (8*(2000/44+44)) bytes.

In the example of FIG. 2, it is assumed that f is equal to 50. Accordingly, if every $50^{th}$ value is stored, the storage requirement for the value reduces to 640 (8*16*40) bytes (as compared to the 32K bytes of decoder 600 of FIG. 6) per MAP decoder 200. For implementations in which multiple MAP decoders 200 are used, the memory savings grow proportionately.

The reverse sweep requires all the $\alpha$ values of the forward sweep. To obtain all the $\alpha$ values, $\alpha$ recalculation module 205 is utilized. Since the $\alpha$ values may be computed recursively, using the $\alpha_1$ value and the $\gamma_1$ value, $\alpha_2$ may be computed. For synchronization with the reverse sweep (and minimum memory usage), the last $\alpha$ values are computed first (since the $\beta$ values are generated in the reverse direction). For example, a frame size of 2000 bits, with every $50^{th}$ $\alpha$ value being stored, $\alpha_{1951}$ is used to determine the block of $\alpha$ values (per step 305) from index 1951–2000 and provided at the same time that the $\beta$ values from 2000 down to 1951 are being generated.

Figure 4B:
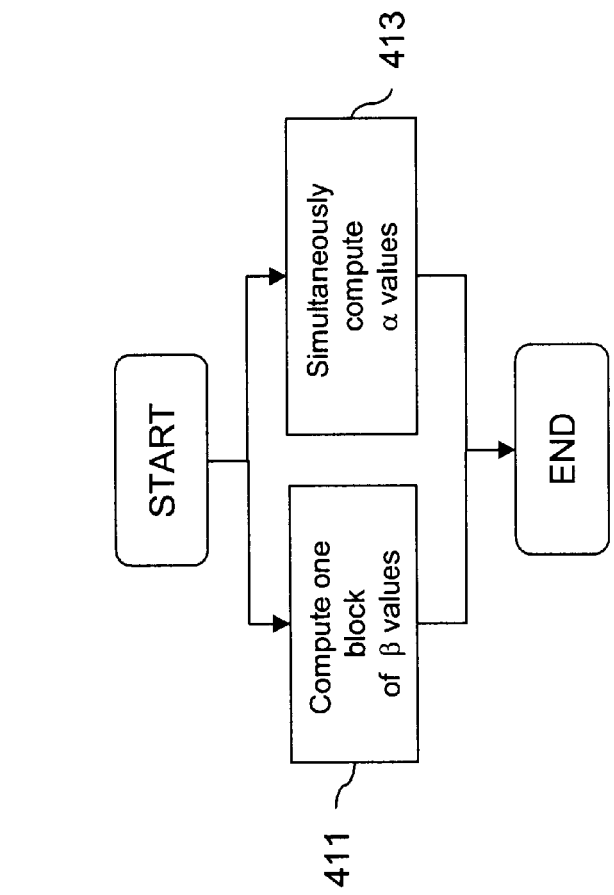
FIGS. 4A–4C are flowcharts of recalculation process of the MAP algorithm, in accordance with an embodiment of the present invention.
Figure 4A:
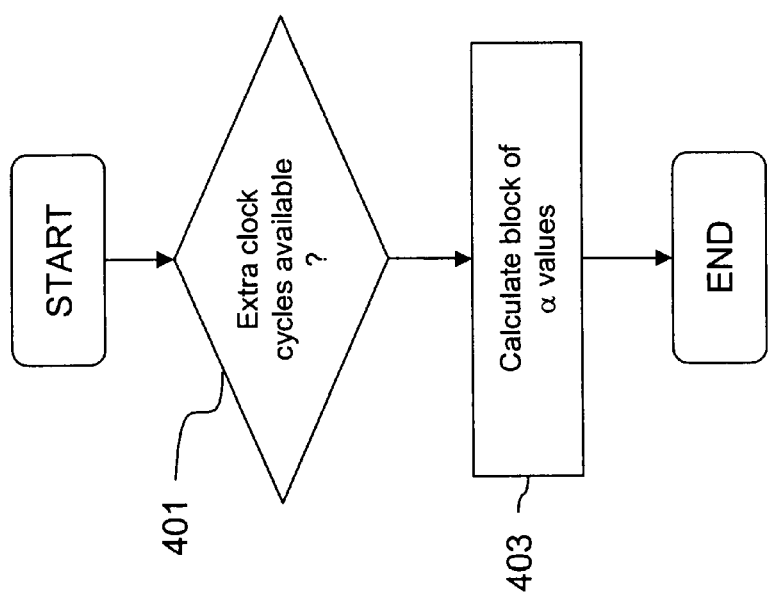
Figure 4C:
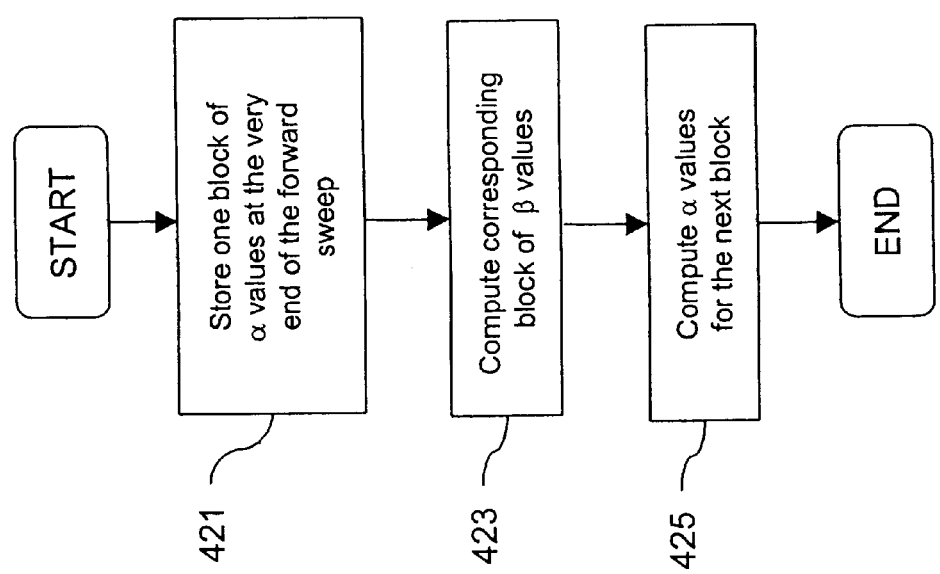

Next, in step 307, the a values are recalculated for each of the blocks. To recalculate the $\alpha$ values for the reverse sweep, three techniques are employed, as shown in FIGS. 4A–4C. In the first approach (as shown in FIG. 4A), if extra clock cycles of decoder 200 are available at the end of the forward sweep and before the reverse (i.e., beta) sweep (per step 401), the block of 50 $\alpha$ values maybe recalculated, as in step 403, during these clock cycles, from index 1951 to 2000, before the reverse sweep yields a first $\beta$ value ($\beta_{2000}$). Turning back to FIG. 3, as in step 309, the $\beta$ values corresponding to the block of 50 $\alpha$ values may be computed by $\beta$ computation module 207. If the clock cycles are not available, either of the two other options below may be implemented.

In the second approach (FIG. 4B), one block of $\beta$ values (2000 down to 1951) is computed (per step 411), while simultaneously computing the $\alpha$ values (index 1951 to 2000), per step 413. The $\alpha$ and $\beta$ values are then combined to determine the extrinsic/a posteriori probability, per step 311. This second approach would additional memory, as compared to the first approach; for the $\alpha$ and $\beta$ values for one block length (50), the memory requirement is 800 (8*16*100) bytes.

As shown in FIG. 4C, the third approach involves storing one block of $\alpha$ values at the very end of the forward sweep, as in step 421. As a result, the $\beta$ computation module 207, in the reverse sweep, is provided with sufficient $\alpha$ values to begin computing the $\beta$ values, per step 423. By the time $\beta$ computation module 207 processes that particular block of $\alpha$ values (index 1951 to 2000), in which a block of $\alpha$ values (index 2000 down to 1951) are computed, the new set of $\alpha$ values may be re-computed (index 1901 to 1950) for the next block (step 425). The $\alpha$ recalculation, thus, always remains ahead of the reverse sweep requirements.

In the first and third approaches described above, additional memory of 800 (8*16*50) bytes are needed over the second approach, leading to a total of 1220 bytes in memory requirements per MAP decoder 200. The second approach requires storage of one block of both the $\alpha$ and $\beta$ values, requiring 1600 (8*16*100) bytes. The total memory required, according to an embodiment of the present invention, can be reduced from 32K bytes to 1.22K bytes.

Further, if the $\Delta$ values (8 bits/time index) also need to be stored out of the forward sweep for use in the reverse sweep, these $\Delta$ values can be stored in the same way as the $\alpha$ values, leading to reduction in storage from 2K (8*2000) bytes to 100 (8*(50+50)) bytes.

Figure 5:
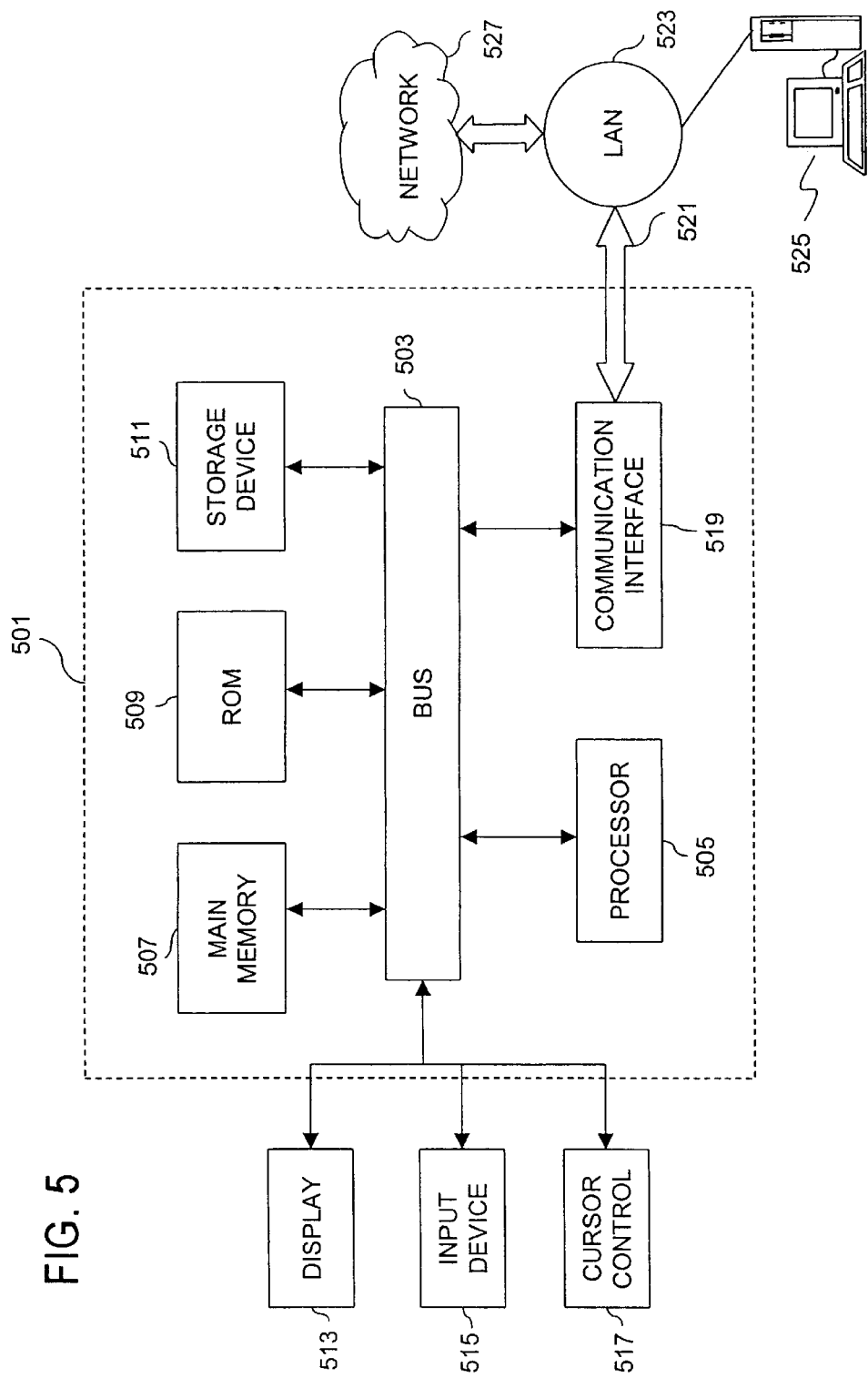
FIG. 5 is a diagram of a computer system that can perform the processes of FIGS. 1–4, in accordance with an embodiment of the present invention.

FIG. 5 is a diagram of a computer system that can perform the processes of FIGS. 1–4, in accordance with an embodiment of the present invention. Computer system 501 includes a bus 503 or other communication mechanism for communicating information, and a processor 505 coupled with bus 503 for processing the information. Computer system 501 also includes a main memory 507, such as a random access memory (RAM) or other dynamic storage device, coupled to bus 503 for storing information and instructions to be executed by processor 505. In addition, main memory 507 may be used for storing temporary variables or other intermediate information during execution of instructions to be executed by processor 505. Computer system 501 further includes a read only memory (ROM) 509 or other static storage device coupled to bus 503 for storing static information and instructions for processor 505. A storage device 511, such as a magnetic disk or optical disk, is provided and coupled to bus 503 for storing information and instructions.

Computer system 501 may be coupled via bus 503 to a display 513, such as a cathode ray tube (CRT), for displaying information to a computer user. An input device 515, including alphanumeric and other keys, is coupled to bus 503 for communicating information and command selections to processor 505. Another type of user input device is cursor control 517, such as a mouse, a trackball, or cursor direction keys for communicating direction information and command selections to processor 505 and for controlling cursor movement on display 513.

According to one embodiment, the reduced-memory implementation of the MAP algorithm is provided by computer system 501 in response to processor 505 executing one or more sequences of one or more instructions contained in main memory 507. Such instructions may be read into main memory 507 from another computer-readable medium, such as storage device 511. Execution of the sequences of instructions contained in main memory 507 causes processor 505 to perform the process steps described herein. One or more processors in a multi-processing arrangement may also be employed to execute the sequences of instructions contained in main memory 507. In alternative embodiments, hard-wired circuitry may be used in place of or in combination with software instructions. Thus, embodiments are not limited to any specific combination of hardware circuitry and software.

Further, the instructions to perform the processes of FIGS. 1–4 may reside on a computer-readable medium. The term "computer-readable medium" as used herein refers to any medium that participates in providing instructions to processor 505 for execution. Such a medium may take many forms, including but not limited to, non-volatile media, volatile media, and transmission media. Non-volatile media includes, for example, optical or magnetic disks, such as storage device 511. Volatile media includes dynamic memory, such as main memory 507. Transmission media includes coaxial cables, copper wire and fiber optics, including the wires that comprise bus 503. Transmission media can also take the form of acoustic or light waves, such as those generated during radio wave and infrared data communication.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 505 for execution. For example, the instructions may initially be carried on a magnetic disk of a remote computer. The remote computer can load the instructions relating to the generation of the physical layer header remotely into its dynamic memory and send the instructions over a telephone line using a modem. A modem local to computer system 501 can receive the data on the telephone line and use an infrared transmitter to convert the data to an infrared signal. An infrared detector coupled to bus 503 can receive the data carried in the infrared signal and place the data on bus 503. Bus 503 carries the data to main memory 507, from which processor 505 retrieves and executes the instructions. The instructions received by main memory 507 may optionally be stored on storage device 511 either before or after execution by processor 505.

Computer system 501 also includes a communication interface 519 coupled to bus 503. Communication interface 519 provides a two-way data communication coupling to a network link 521 that is connected to a local network 523. For example, communication interface 519 may be a network interface card to attach to any packet switched local area network (LAN). As another example, communication interface 519 may be an asymmetrical digital subscriber line (ADSL) card, an integrated services digital network (ISDN) card or a modem to provide a data communication connection to a corresponding type of telephone line. Wireless links may also be implemented. In any such implementation, communication interface 519 sends and receives electrical, electromagnetic or optical signals that carry digital data streams representing various types of information.

Network link 521 typically provides data communication through one or more networks to other data devices. For example, network link 521 may provide a connection through local network 523 to a host computer 525 or to data equipment operated by a service provider, which provides data communication services through a communication network 527 (e.g., the Internet). LAN 523 and network 527 both use electrical, electromagnetic or optical signals that carry digital data streams. The signals through the various networks and the signals on network link 521 and through communication interface 519, which carry the digital data to and from computer system 501, are exemplary forms of carrier waves transporting the information. Computer system 501 can transmit notifications and receive data, including program code, through the network(s), network link 521 and communication interface 519.

The techniques described herein provide several advantages over prior approaches to implementing the MAP algorithm to decode signals that have been encoded using linear block codes or convolutional codes. According to one embodiment of the present invention, a decoder includes a γ computation module that outputs a transition probability values in response to soft decision input values. An α computation module within the decoder calculates α values based upon the transition probability values. The decoder contains a memory that stores periodically the α values based upon a predetermined period (f). The α values are partitioned into blocks corresponding to the predetermined period. A recalculating module of the decoder recalculates the α values within each of the blocks. A β computation module calculates β values based upon the recalculated α values, wherein the β values are calculated in reverse order relative to the α values. This approach advantageously minimizes the use of memory to implement, in an exemplary embodiment, the MAP algorithm.

Obviously, numerous modifications and variations of the present invention are possible in light of the above teachings. It is therefore to be understood that within the scope of the appended claims, the invention may be practiced otherwise than as specifically described herein.

Lists of References

[1] L. R. Bahl, J. Cocke, F. Jelinek and J. Raviv, "Optimal Decoding of Linear Codes for Minimizing Symbol Error Rate", *IEEE Transactions on Information Theory*, March 1974, vol. IT-20, pp. 284–287.

[2] Claude Berrou, Alain Glavieux and Punya Thitimajshima, "Near Shannon Limit Error-correcting Coding and Decoding: Turbo Codes (1)", *Proc., IEEE Conference on Communications*, May 1993, pp. 1064–1070.

What is claimed is:

1. A method of performing computations, the method comprising:

calculating a first series of values based upon a plurality of input values;

storing the first series of values according to a predetermined scheme;

recalculating the first series of values starting with a last value of the first series and proceeding towards a first value of the first series;

calculating a second series of values; and generating a plurality of output values based upon the recalculated first series of values and the second series of values.

2. The method according to claim 1, wherein the input values in the step of calculating the first series of values represent transition probability values, the output values being A Posteriori probability values.

3. The method according to claim 1, further comprising:

normalizing the second series of values.

4. The method according to claim 1, wherein the predetermined scheme in the storing step provides for storing every $f^{th}$ value, f being an integer.

5. The method according to claim 4, wherein the plurality of input values correspond to a frame of a predetermined size, f in the storing step being approximately equal to square-root of the frame size.

6. The method according to claim 4, wherein the first series of values are partitioned into a plurality of blocks according to the f value, each of the plurality of blocks containing f number of the first series of values, the recalculating step comprising:

calculating the first series of values within each of the plurality of blocks according to a reverse order.

7. A decoding apparatus comprising:

means for calculating a first series of values based upon a plurality of input values;

means for storing the first series of values according to a predetermined scheme;

means for recalculating the first series of values starting with a last value of the first series and proceeding towards a first value of the first series;

means for calculating a second series of values; and means for generating a plurality of output values based upon the recalculated first series of values and the second series of values.

8. The apparatus according to claim 7, wherein the input values represent transition probability values, the apparatus further comprising:

means for combining the first series of values and the second series of values to generate A Posteriori probability values.

9. The apparatus according to claim 7, further comprising:

means for normalizing the second series of values.

10. The apparatus according to claim 7, wherein the predetermined scheme provides for storing every $f^{th}$ value, f being an integer.

11. The apparatus according to claim 10, wherein the plurality of input values correspond to a frame of a predetermined size, f being approximately equal to square-root of the frame size.

12. The apparatus according to claim 10, wherein the first series of values are partitioned into a plurality of blocks according to the f value, each of the plurality of blocks containing f number of the first series of values, the recalculating means calculating the first series of values within each of the plurality of blocks according to a reverse order.

13. A method of decoding a bit stream received from a communication channel, the method comprising:

receiving a plurality of transition probability values;

calculating a first series of values based upon the plurality of transition probability values;

periodically storing the first series of values based upon a predetermined period (f), the first series of values being partitioned into blocks corresponding to the predetermined period;

recalculating the first series of values associated with each of the blocks; and calculating a second series of values, wherein the second series of values are calculated in reverse order relative to the calculation of the first series of values.

14. The method according to claim 13, wherein, on a block by block basis, the recalculating step and the step of calculating the second series of values are performed.

15. The method according to claim 13, wherein the recalculating step and the step of calculating the second series of values are performed concurrently.

16. The method according to claim 13, wherein the recalculating step comprises:

storing one of the blocks of the first series of values, wherein the calculated second series of values correspond to the first series of values of the one block.

17. The method according to claim 13, further comprising:

combining the first series of values and the second series of values to generate A Posteriori probability values.

18. The method according to claim 13, wherein the bit stream is of a predetermined size (F), f being approximately equal to square-root of F.

19. The method according to claim 13, further comprising:

periodically storing normalization values based upon the predetermined period; and combining the first series of values, the second series of values, and the normalization values to generate A Posteriori probability values.

20. A decoder for performing a Maximum A Posteriori (MAP) algorithm to decode a bit stream received from a communication channel, the decoder comprising:

a γ computation module configured to output a plurality of transition probability values in response to a plurality of soft decision input values;

an α computation module configured to calculate α values based upon the plurality of transition probability values;

a memory configured to store periodically the α values based upon a predetermined period (f), the α values being partitioned into blocks corresponding to the predetermined period;

a recalculation module configured to recalculate the α values within each of the blocks; and a β computation module configured to calculate β values based upon the recalculated α values, wherein the β values are calculated in reverse order relative to the calculation of the α values.

21. The decoder according to claim 20, wherein, on a block by block basis, the recalculation module recalculates α values and the β computation module subsequently calculates the β values.

22. The decoder according to claim 20, wherein the recalculation module and the β computation module operate concurrently to calculate the β values.

23. The decoder according to claim 20, wherein the memory stores one of the blocks of the α values, which are used by the β computation module to calculate the corresponding β values.

24. The decoder according to claim 20, further comprising:

an A Posteriori computation module configured to combine the α values and the β values to generate A Posteriori probability values.

25. The decoder according to claim 20, wherein the bit stream is of a predetermined size (F), f being approximately equal to square-root of F.

26. The decoder according to claim 20, wherein the α computation module outputs normalization (Δ) values to the recalculation module, the normalization values being periodically stored in the memory according to the predetermined period and being input into the β computation module.

27. A decoding system for decoding at least one of linear block codes and convolutional codes corresponding to a bit stream, the system comprising:

a soft decision module configured to generate a plurality of soft decision input values associated with the bit stream; and a plurality of decoders coupled to the soft decision module, each of the plurality of decoders comprising, a γ computation module configured to output a plurality of transition probability values in response to the plurality of soft decision input values, an α computation module configured to calculate α values based upon the plurality of transition probability values, a memory configured to store periodically the α values based upon a predetermined period (f), the α values being partitioned into blocks corresponding to the predetermined period, a recalculation module configured to recalculate the α values within each of the blocks, and a β computation module configured to calculate β values based upon the recalculated α values, wherein the β values are calculated in reverse order relative to the calculation of the α values.

28. The decoding system according to claim 27, wherein, on a block by block basis, the recalculation module recalculates α values and the β computation module subsequently calculates the β values.

29. The decoding system according to claim 27, wherein the recalculation module and the β computation module operate concurrently to calculate the β values.

30. The decoding system according to claim 27, wherein the memory stores one of the blocks of the α values, which are used by the β computation module to calculate the corresponding β values.

31. The decoding system according to claim 27, wherein each of the plurality of decoders further comprises:

an A Posteriori computation module configured to combine the α values and the β values to generate A Posteriori probability values.

32. The decoding system according to claim 27, wherein the bit stream is of a predetermined size (F), f being approximately equal to square-root of F.

33. The decoding system according to claim 27, wherein the α computation module outputs normalization (Δ) values to the recalculation module, the normalization values being periodically stored in the memory according to the predetermined period and being input into the β computation module.

34. A computer-readable medium carrying one or more sequences of one or more instructions for performing computations, the one or more sequences of one or more instructions including instructions which, when executed by one or more processors, cause the one or more processors to perform the steps of:

calculating a first series of values based upon a plurality of input values;

storing the first series of values according to a predetermined scheme;

recalculating the first series of values starting with a last value of the first series and proceeding towards a first value of the first series;

calculating a second series of values; and generating a plurality of output values based upon the recalculated first series of values and the second series of values.

35. The computer readable-medium according to claim 34, wherein the predetermined scheme in the storing step provides for storing every $f^{th}$ value, f being an integer.

36. The computer readable-medium according to claim 34, wherein the plurality of input values correspond to a frame of a predetermined size, f in the storing step being approximately equal to square-root of the frame size.

37. The computer readable-medium according to claim 34, wherein the first series of values are partitioned into a plurality of blocks according to the f value, each of the plurality of blocks containing f number of the first series of values, the recalculating step comprising:

calculating the first series of values within each of the plurality of blocks according to a reverse order.

38. The computer readable-medium according to claim 34, wherein the input values in the step of calculating the first series of values represent transition probability values, the output values being A Posteriori probability values.

39. The computer readable-medium according to claim 34, further comprising computer-executable instructions for causing the one or more processors to perform the step of:

normalizing the second series of values.

* * * * *